(12) United States Patent
Kim et al.

(10) Patent No.: US 8,866,310 B2
(45) Date of Patent: Oct. 21, 2014

(54) SEMICONDUCTOR DEVICE

(71) Applicant: Samsung Electronics Co., Ltd., Suwon-si (KR)

(72) Inventors: Yonghoon Kim, Suwon-si (KR); Keung Beum Kim, Hwaseong-si (KR); Seongho Shin, Hwaseong-si (KR); Seung-Yong Cha, Hwaseong-si (KR); Inho Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/746,853

(22) Filed: Jan. 22, 2013

(65) Prior Publication Data

US 2013/0313706 A1    Nov. 28, 2013

(30) Foreign Application Priority Data

May 25, 2012    (KR) .................. 10-2012-0055995

(51) Int. Cl.
*H01L 23/48* (2006.01)
*H01L 23/52* (2006.01)
(Continued)

(52) U.S. Cl.
CPC ....... *H01L 24/17* (2013.01); *H01L 2924/15311* (2013.01); *H01L 23/49811* (2013.01); *H01L 2225/06562* (2013.01); *H01L 2224/32225* (2013.01); *H01L 2924/15331* (2013.01); *H01L 23/49838* (2013.01); *H01L 2224/32145* (2013.01); *H01L 2224/48227* (2013.01); *H01L 2224/81192* (2013.01); *H01L 2224/131* (2013.01); *H01L 25/0657* (2013.01); *H01L 25/105* (2013.01); *H01L 2225/1058* (2013.01); *H01L 2224/16225* (2013.01); *H01L 2224/73204* (2013.01); *H01L 2224/73265* (2013.01); *H01L 2225/0651* (2013.01); *H01L 2225/1023* (2013.01)
USPC .......................................... 257/777; 257/738

(58) Field of Classification Search
None
See application file for complete search history.

(56) References Cited

U.S. PATENT DOCUMENTS

| 7,180,165 | B2 | 2/2007 | Ellsberry et al. |
| 7,795,743 | B2 | 9/2010 | Kim et al. |

(Continued)

FOREIGN PATENT DOCUMENTS

| JP | 2007-027526 |   | 2/2007 |
| JP | 2010-153651 |   | 7/2010 |
| JP | 2011-009488 | * | 1/2011 |
| JP | 2011-222807 |   | 11/2011 |

* cited by examiner

*Primary Examiner* — Sonya D McCall Shepard
(74) *Attorney, Agent, or Firm* — Onello & Mello, LLP

(57) ABSTRACT

A semiconductor device is provided, which comprises a first semiconductor package, a second semiconductor package, and a connection structure. The first semiconductor package includes a first substrate. The first substrate includes a first region and a second region. The second semiconductor package is mounted on the first semiconductor package. The connection structure electrically connects the second semiconductor package and the first semiconductor package. The connection structure comprises first connection patterns at the first region. The first connection patterns provide a data signal at the first region. The connection structure further comprises second connection patterns at the second region. The second connection patterns provide a control/address signal at the second region. A number of the second connection patterns is less than a number of the first connection patterns.

10 Claims, 10 Drawing Sheets

(51) Int. Cl.
*H01L 29/40* (2006.01)
*H01L 23/498* (2006.01)
*H01L 23/00* (2006.01)
*H01L 25/10* (2006.01)
*H01L 25/065* (2006.01)

(56) References Cited

U.S. PATENT DOCUMENTS

| 7,880,276 | B2 | 2/2011 | Nishimura et al. | |
|---|---|---|---|---|
| 2008/0303153 | A1 | 12/2008 | Oi et al. | |
| 2009/0020885 | A1* | 1/2009 | Onodera | 257/777 |
| 2011/0116247 | A1 | 5/2011 | Kim et al. | |

SEMICONDUCTOR DEVICE

CROSS-REFERENCE TO RELATED APPLICATIONS

This U.S. non-provisional patent application claims priority under 35 U.S.C. §119 to Korean Patent Application No. 10-2012-0055995, filed on May 25, 2012, the entirety of which is incorporated by reference herein.

BACKGROUND

The inventive concepts relate to a semiconductor device and, more particularly, to a package-on-package (POP) technique.

Semiconductor devices are widely used in various electronic industries because of their small size, multi-functional features, and/or low manufacturing costs. Semiconductor devices may include memory devices that store logic data, logic devices that process the logic data, and/or system on chips (SOCs) that perform various functions known to those of ordinary skill in the art.

Highly integrated semiconductor devices are in an increasing demand as electronic industries continue to grow and develop. Various problems may occur during manufacturing of semiconductor devices, such that formation of the semiconductor devices is becoming increasingly difficult. Additionally, high speed semiconductor devices have experienced greater demand due to the development and growth of the electronic industries. Various research efforts have been performed in an attempt to satisfy the abovementioned demands.

SUMMARY

Embodiments of the inventive concept may provide highly integrated semiconductor devices.

In accordance with an aspect, provided is a semiconductor device comprising a first semiconductor package, a second semiconductor package, and a connection structure. The first semiconductor package includes a first substrate. The first substrate includes a first region and a second region. The second semiconductor package is mounted on the first semiconductor package. The connection structure electrically connects the second semiconductor package and the first semiconductor package. The connection structure comprises first connection patterns at the first region. The first connection patterns provide a data signal at the first region. The connection structure further comprises second connection patterns at the second region. The second connection patterns provide a control/address signal at the second region. A number of the second connection patterns is less than a number of the first connection patterns.

In an embodiment, the first semiconductor package further comprises a first semiconductor chip at a center portion of the first substrate.

In an embodiment, the first and second regions are at edge portions of the first substrate, wherein the first substrate includes a first vertex at a first intersection of the first region and the second region and a second vertex at a second intersection of the first region and the second region, the first and second vertices not neighboring each other, and a line extends through a center of the first substrate to connect the first and second vertices.

In an embodiment, the first connection patterns include a plurality of first solder balls, and the first solder balls are aligned along a plurality of columns; and the second connection patterns include a plurality of second solder balls, and the second solder balls are aligned along at least one column.

In an embodiment, the number of the columns of the first connection patterns is greater than the number of the at least one column of the second connection patterns.

In an embodiment, a separation distance between two or more first connection patterns is greater than a mean value of separation distances between the first connection patterns.

In an embodiment, the two or more first connection patterns are spaced apart from each other by the separation distance greater than the mean value and are adjacent a center portion of the first substrate.

In an embodiment, a size of each of the first connection patterns is smaller than a size of each of the second connection patterns.

In an embodiment, the second semiconductor package includes a second substrate and at least one semiconductor chip on the second substrate.

In accordance with another aspect, provided is semiconductor device comprising a first semiconductor package and a connection structure. The first semiconductor package including a first substrate. The first substrate includes a first region and a second region. The connection structure electrically connecting the first semiconductor package and a second semiconductor package. The connection structure comprises first connection patterns at the first region. The first connection patterns provide a data signal at the first region. The connection structure further comprises second connection patterns at the second region. The second connection patterns provide a control/address signal at the second region. A surface area of the first region is greater than a surface area of the second region.

In an embodiment, a number of the second connection patterns is less than a number of the first connection patterns.

In an embodiment, the first semiconductor package further comprises: a first semiconductor chip at a center portion of the first substrate.

In an embodiment, the first and second regions are at edge portions of the first substrate, wherein the first substrate includes a first vertex at a first intersection of the first region and the second region and a second vertex at a second intersection of the first region and the second region, the first and second vertices not neighboring each other, and a line extends through a center of the first substrate to connect the first and second vertices.

In an embodiment, the first connection patterns include a plurality of first solder balls, and the first solder balls are aligned along a plurality of columns, and wherein the second connection patterns include a plurality of second solder balls, and the second solder balls are aligned along at least one column.

In an embodiment, the number of the columns of the first connection patterns is greater than the number of the at least one column of the second connection patterns.

In an embodiment, a separation distance between two or more first connection patterns is greater than a mean value of separation distances between the first connection patterns.

In an embodiment, the two or more first connection patterns are spaced apart from each other by the separation distance greater than the mean value and are adjacent a center portion of the first substrate.

In an embodiment, a size of each of the first connection patterns is smaller than a size of each of the second connection patterns.

In an embodiment, the semiconductor device further comprises the second semiconductor package, the second semiconductor package including a second substrate and at least one semiconductor chip on the second substrate.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
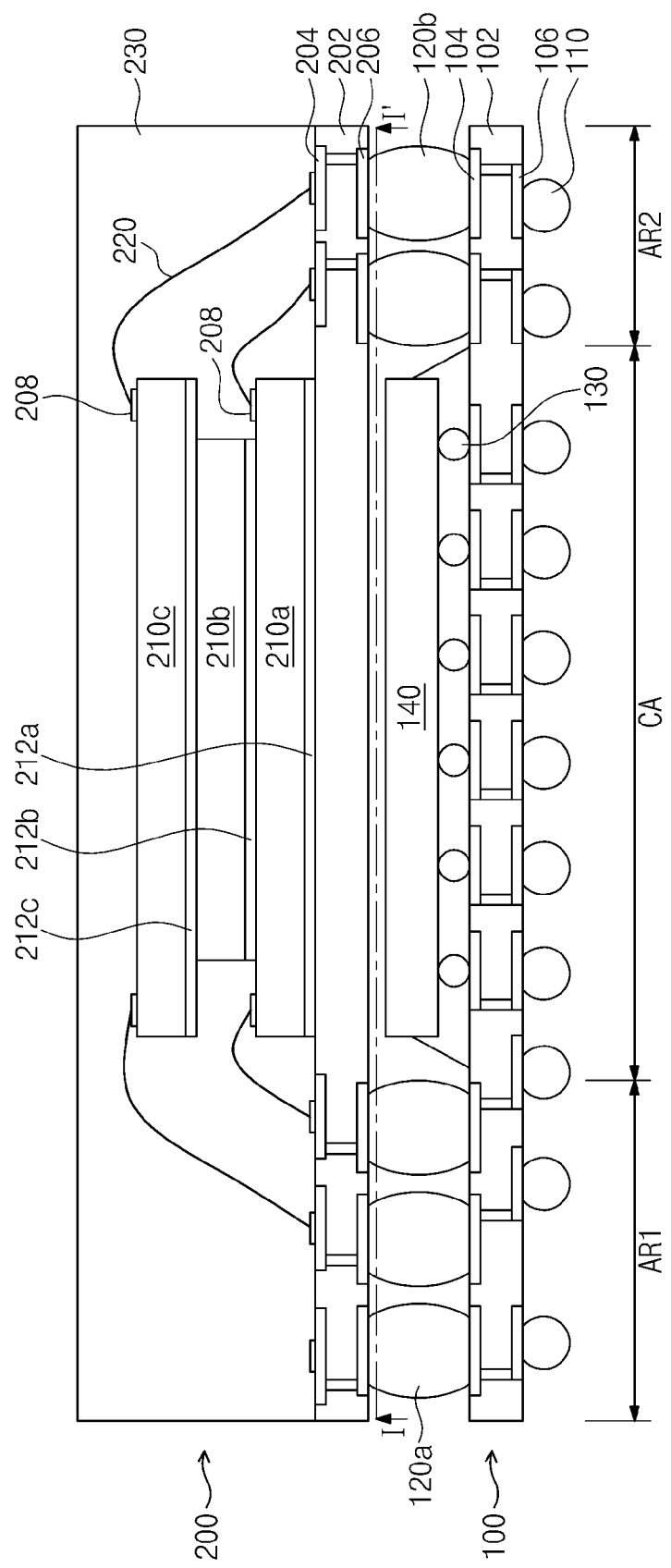
FIG. 1 is a cross-sectional view of a semiconductor device according to some embodiments of the inventive concepts.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
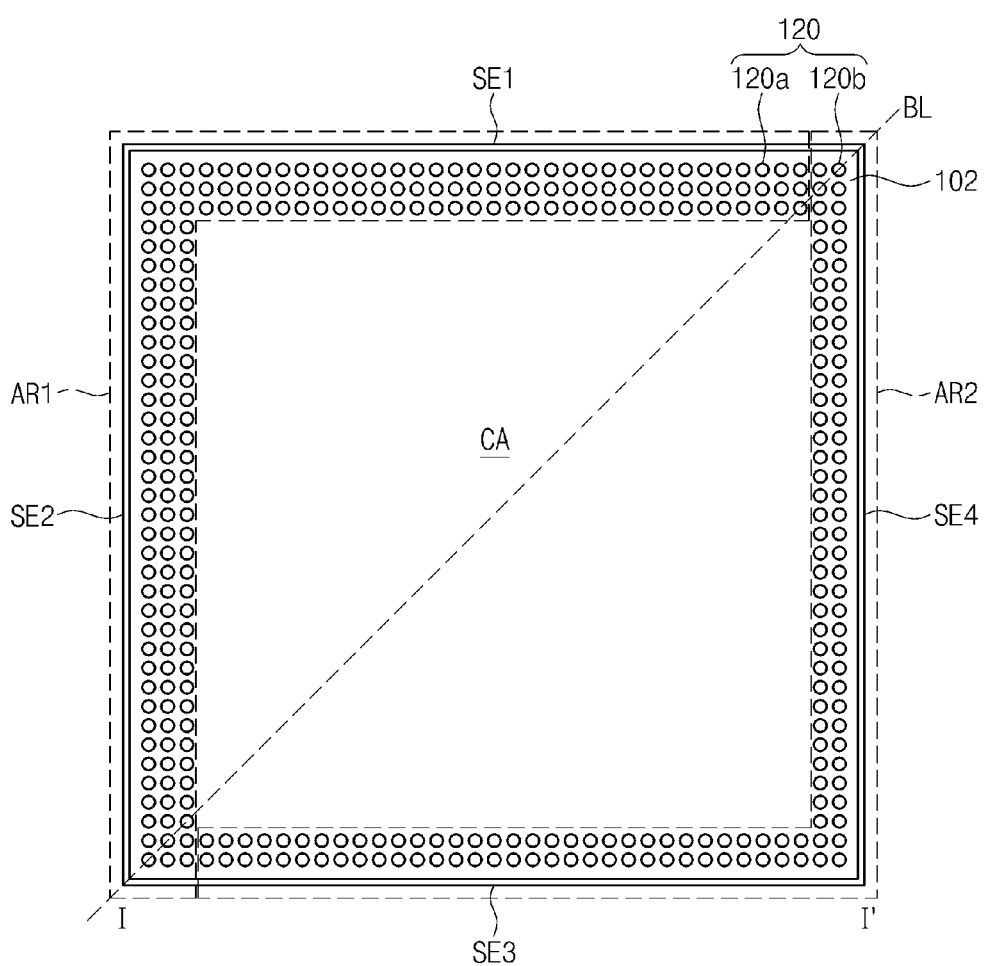
FIG. 2 is a plan view of the semiconductor device of FIG. 1 shown from a line I-I' of FIG. 1, according to some embodiments of the inventive concepts.

FIG. 1 is a cross-sectional view of a semiconductor device according to some embodiments of the inventive concepts. FIG. 2 is a plan view shown from a line I-I' of FIG. 1.

Referring to FIGS. 1 and 2, a semiconductor device may include a first semiconductor package 100, a second semiconductor package 200 mounted on the first semiconductor package 100, and a connection structure 120a, 120b (generally, 120) that electrically connects the first semiconductor package 100 to the second semiconductor package 200.

The semiconductor package 100 may include a first substrate 102 and a first semiconductor chip 140. The first substrate 102 may be a printed circuit board (PCB). The first substrate 102 may include a first surface on which the first semiconductor chip 140 is mounted and a second surface opposite to the first surface, which may be electrically connected to one or more external terminals 110.

According to some embodiments of the inventive concepts, the first substrate 102 may include a chip region CA on which the first semiconductor chip 140 may be mounted, and connection regions AR1 and AR2 on which the connection structure 120 may be disposed. The chip region CA may be at a center portion of the first substrate 102, and the connection regions AR1 and AR2 may be at edge portions of the first substrate 102.

A plurality of first pads 104 may be disposed on the first surface of the first substrate 102. The first pads 104 may be formed on the chip region CA and the connection regions AR1 and AR2. The first pads 104 on the chip region CA may be electrically connected to the first semiconductor chip 140 through solder balls 130. The first pads 104 at the connection regions AR1 and/or AR2 may be electrically connected to the connection structure 120.

A plurality of second pads 106 may be disposed on the second surface of the first substrate 102. The external terminals 110 may be electrically in contact with the second pads 106, respectively.

The second semiconductor package 200 may include a second substrate 202, second semiconductor chips 210a, 210b, and 210c mounted on the second substrate 202, and a molding part 230 covering the second substrate 202 and the second semiconductor chips 210a, 210b, and 210c.

The second substrate 202 may include a first surface and a second surface opposite each other. The second semiconductor chips 210a, 210b, and 210c are mounted on the first surface of the second substrate 202. The second surface of the second substrate 202 may face the first substrate 102. First pads 204 may be formed on the first surface of the second substrate 202. Second pads 206 may be formed on the second surface of the second substrate 202.

The second semiconductor chips 210a, 210b, and 210c may be sequentially stacked on the first surface of the second substrate 202. In the present embodiment, three of the second semiconductor chips 210a, 210b, and 210c may be stacked. Although three second semiconductor chips 210a, 210b, 210c are shown, the inventive concepts are not limited to the number of the second semiconductor chips. For example, four or more second semiconductor chips can be stacked on the first surface of the second substrate 202.

Some or all of the second semiconductor chips 210a, 210b, and 210c may include one or more chip pads 208. The chip pads 208 may be electrically connected to the first pads 204 of the second substrate 202 via bonding wires 220. In some embodiments, the second semiconductor chips 210a, 210b, and 210c, respectively, may have different configurations, for example, different sizes, with respect to each other, and may be stacked to expose the chip pads 208 positioned on one or more of the second semiconductor chips 210a, 210b, and 210c. In other embodiments, the second semiconductor chips 210a, 210b, and 210c may be moved in one direction and stacked to expose the chip pads 208 thereof.

The second semiconductor package 200 may further include adhesive parts 212a, 212b, and 212c adhering the second substrate 202 and the second semiconductor chip 210a to each other and adhering the second semiconductor chips 210a, 210b, and 210b to each other.

The connection structure 120 may be disposed on the connection regions AR1 and AR2, respectively, of the first substrate 102. The connection regions AR1 and AR2 may include a first connection region AR1, where data signals are provided to the semiconductor device, and a second connection region AR2, wherein control/address signals are provided to the semiconductor device. The first and second regions AR1 and AR2 may also be different edge portions of the first substrate 102.

In some embodiments, the first substrate 102 has a polygon-shape with respect to a plan view. Here, the first connection region AR1 can be at two sides of the first substrate 102 and the second connection region AR2 can be at the remaining sides of the first substrate 102. The first substrate 102 can include a first vertex at a first intersection of the first connection region AR1 and the second connection region AR2. The first substrate 102 can include a second vertex at a second intersection of the first connection region AR1 and the second connection region AR2. In this manner, the first and second vertexes can be at opposite corners of the first substrate 102. A line BL can extend through a center of the first substrate 102 to connect the first and second vertices not neighboring each other.

The connection structure 120 may include first connection patterns 120a disposed on the first connection region AR1 and second connection patterns 120b disposed on the second connection region AR2. Each of the first and second connection patterns 120a and 120b may include a solder ball. The first connection patterns 120a may be arranged in a row direction and a column direction, and the second connection patterns 120b may also be arranged in a row direction and a column direction in a plan view. In some embodiments, the number of the first connection patterns 120a may be greater than the number of the second connection patterns 120b. Thus, sizes, for example, surface areas, of the first and second regions AR1 and AR2 may be asymmetric with respect to each other. For example, the surface area of the first connection region AR1 may be greater than the surface area of the second connection region AR2. Thus, in embodiments where the first connection patterns 120a and the second connection patterns 120b are of an equal size, a greater number of first connection patterns 120a can be positioned at the first connection region AR1 than a number of second connection patterns 120b position at the second connection region AR2.

Referring to FIG. 2, the first substrate 102 may have a square-shape in a plan view. Here, the first substrate 102 may include a first segment SE1, a second segment SE2 adjacent the first segment SE1, a third segment SE3 adjacent the second segment SE2 and facing the first segment SE1, and a fourth segment SE4 adjacent the third segment SE3 and facing the second segment SE2. The first connection patterns 120a may be disposed to be adjacent the first segment SE1 and the second segment SE2. The second connection patterns 120b may be disposed to be adjacent the third segment SE3 and the fourth segment SE4. For example, as shown in FIG. 2, the first connection patterns 120a may be positioned along three columns, and the second connection patterns 120b may be positioned along two columns. Here, the first and second connection patterns 120a and 120b may include solder balls having substantially the same size and the same shape.

The number of the first connection patterns 120a providing the data signals may be greater than the number of the second connection patterns 120b providing the control/address signals, for example, shown in FIG. 2. However, the inventive concepts are not limited thereto. For example, in other embodiments, the number of first connection patterns 120a are equal to the number of second connection patterns 120b. In this example, the first connection patterns 120a may line extend along two columns, and the second connection patterns 120b may also extend along two columns.

It may be required to increase the number of the first connection patterns 120a applied with the data signals to increase an integration degree of the semiconductor device. According to an embodiment, the number of the first connection patterns 120a can be increased and the number of the second connection patterns 120b can be maintained. Thus, it is possible to suppress an increase of a size of the semiconductor device, notwithstanding that the number of patterns 120 can be increased. Additionally, the number of the second connection patterns 120b may be maintained to secure an area. The freedom degree of design of the first and second connection patterns 120a and 120b may be increased by the secured area.

Figure 3:
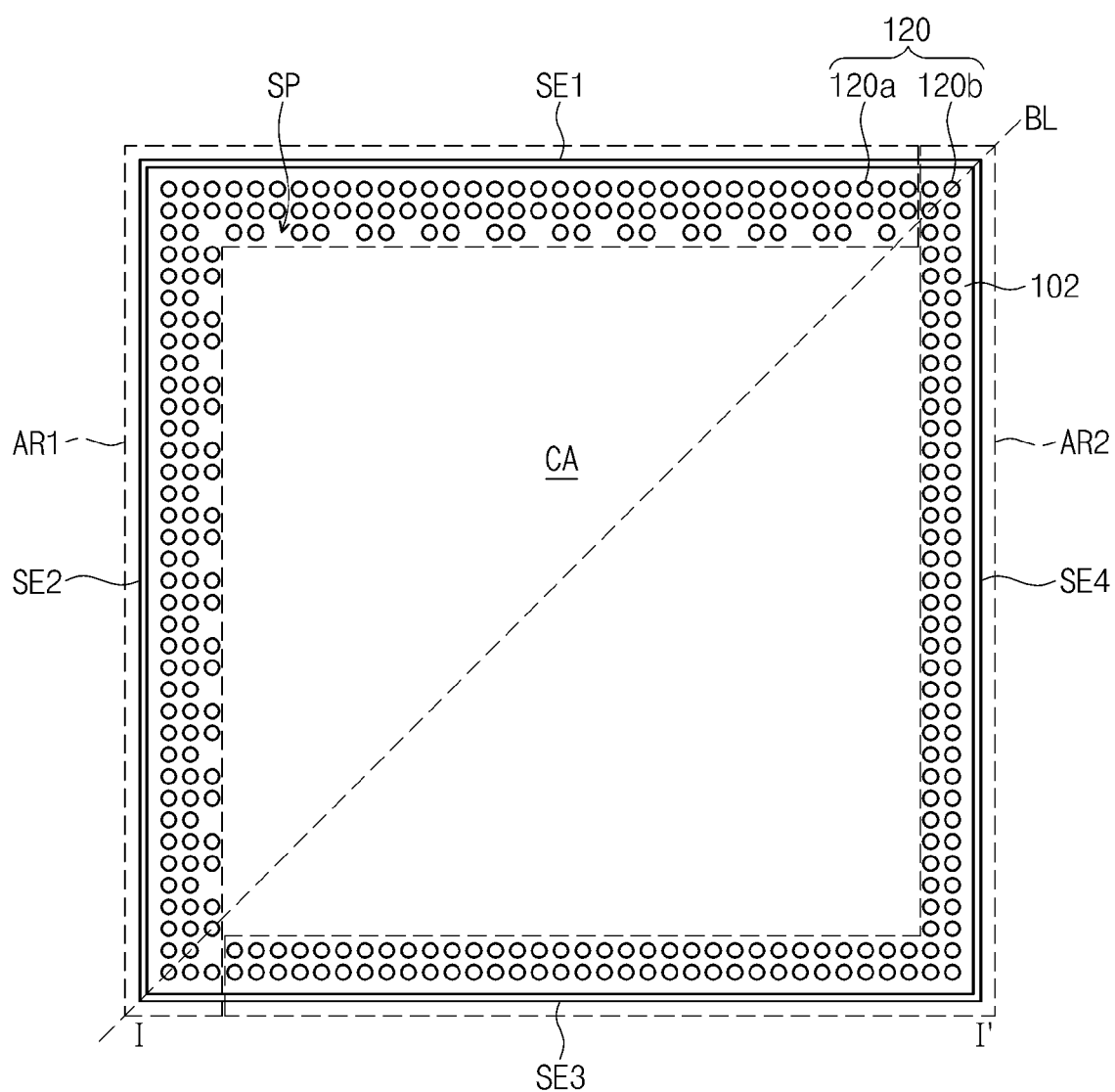
FIG. 3 is a plan view illustrating a semiconductor device according to other embodiments of the inventive concepts.

FIG. 3 is a plan view illustrating a semiconductor device according to other embodiments of the inventive concepts.

Referring to FIGS. 1 and 3, a semiconductor device may include a first semiconductor package 100, a second semiconductor package 200 mounted on the first semiconductor package 100, and a connection structure 120 that electrically connects the first semiconductor package 100 to the second semiconductor package 200.

Elements of the semiconductor device according to the present embodiment may be substantially the same as corresponding elements described with reference to FIGS. 1 and 2. However, an arrangement of the connection structure 120 according to the present embodiment is different from that of the connection structure 120 of FIG. 2. The arrangement of the connection structure 120 according to the present embodiment is described in greater detail below.

Referring to FIG. 3, the connection structure 120 may be disposed on connection regions AR1 and AR2 of the first substrate 102. The connection regions AR1 and AR2 may include a first connection region AR1 that provides data signals to the semiconductor device, and a second connection region AR2 that provides control/address signals to the semiconductor device. The first and second regions AR1 and AR2 may be at edge portions of the first substrate 102.

In some embodiments, wherein the first substrate 102 has a polygon-shape in a plan view, the first and second regions AR1 and AR2 may face each other with respect to a line BL passing through a center of the first substrate 102 and connecting vertexes not neighboring each other.

The connection structure 120 may include first connection patterns 120a disposed on the first connection region AR1 and second connection patterns 120b disposed on the second connection region AR2. Each of the first and second connection patterns 120a and 120b may include a solder ball. The first connection patterns 120a may be arranged in a row direction and a column direction, and the second connection patterns 120b may also be arranged in a row direction and a column direction in a plan view. In some embodiments, the number of the first connection patterns 120a may be greater than the number of the second connection patterns 120b. Thus, sizes of the first and second regions AR1 and AR2 may be asymmetric with respect to each other. In other words, the size of the first connection region AR1 may be greater than the size of the second connection region AR2.

Referring to FIG. 3, if the first substrate 102 may have a square-shape in a plan view. Here, the first substrate 102 may include first to fourth segments SE1, SE2, SE3, and SE4. The first connection patterns 120a may be adjacent the first and second segments SE1 and SE2, and the second connection patterns 120b may be adjacent the third and fourth segments SE3 and SE4.

In some embodiments, if the first connection patterns 120a are constructed and arranged in three columns, then the second connection patterns 120b are constructed and arranged in two columns. Here, at least one of the three columns of the first connection patterns 120a may include one or more spaces SP between first connection patterns 120a. A column including spaces SP may be adjacent to first semiconductor chip 140. Thus, a separation distance between some of the first connection patterns 120a may be greater than the mean value of separation distances between first connection patterns 120a. For example, as illustrated in FIG. 3, one of the three the first connection patterns 120a adjacent each other may be removed to form the space SP. The first and second connection patterns 120a and 120b may be formed as solder balls, each having the same size and the same shape.

In an embodiment, the number of the first connection patterns 120a can be increased to satisfy a requirement according to an integration improvement of the semiconductor device. However, the number of the second connection patterns 120b can be maintained. Thus, it is possible to suppress the increase of the size of the semiconductor device, notwithstanding that the number of first connection patterns 120a can be increased. Additionally, the number of the second connection patterns 120b may be maintained to secure an area. The freedom degree of design of the first and second connection patterns 120a and 120b may be increased by the secured area.

Figure 4:
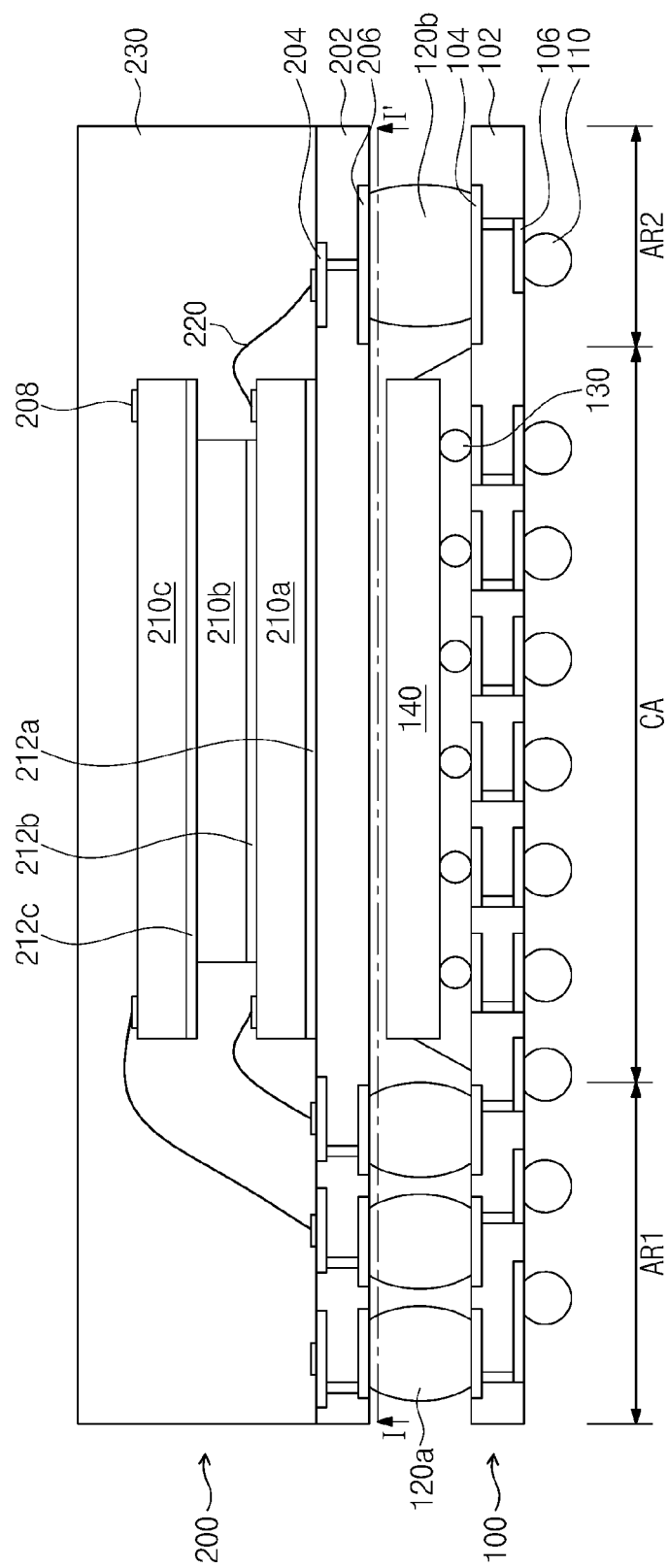
FIG. 4 is a cross-sectional view of a semiconductor device according to other embodiments of the inventive concepts.
Figure 5:
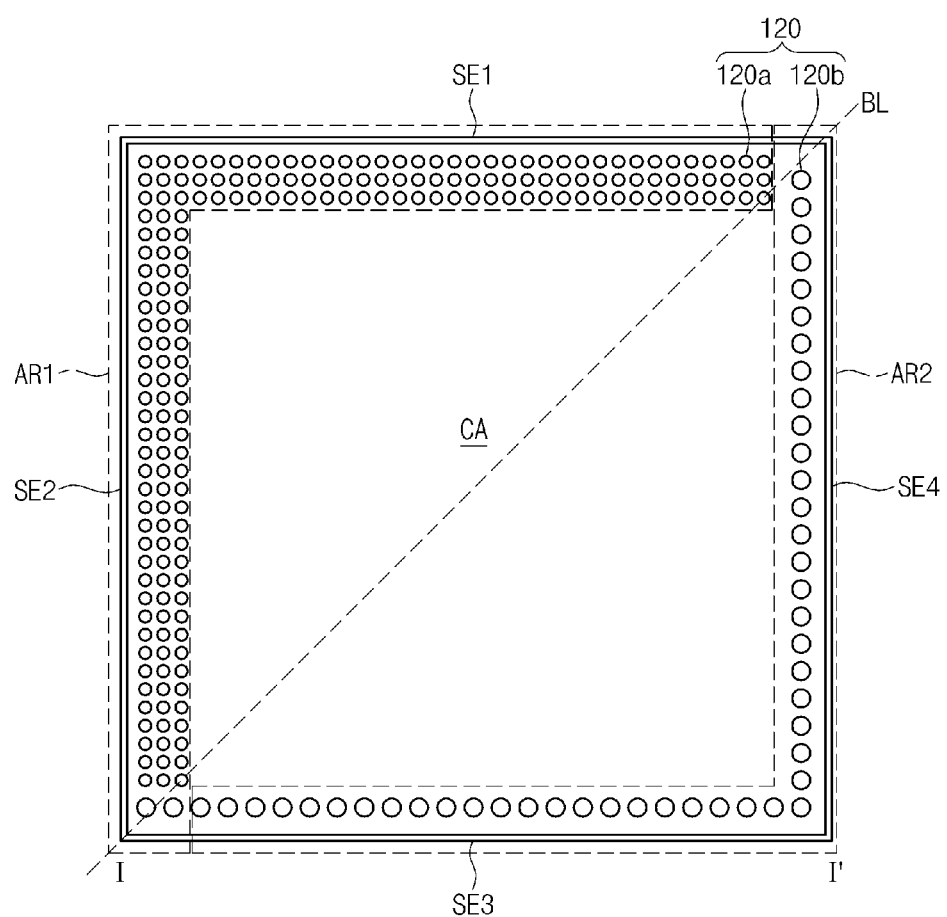
FIG. 5 is a plan view of the semiconductor device of FIG. 4, according to some embodiments of the inventive concepts.

FIG. 4 is a cross-sectional view of a semiconductor device according to other embodiments of the inventive concepts. FIG. 5 is a plan view of the semiconductor device of FIG. 4, according to some embodiments of the inventive concepts.

Referring to FIGS. 4 and 5, a semiconductor device may include a first semiconductor package 100, a second semiconductor package 200 mounted on the first semiconductor package 100, and a connection structure 120 electrically connecting the first semiconductor package 100 to the second semiconductor package 200.

Elements of the semiconductor device according to the present embodiment may be substantially the same as corresponding elements described with reference to FIGS. 1 and 2. Therefore, a description of these elements will not be repeated for brevity. However, an arrangement of the connection structure 120 according to the present embodiments is different from that of the connection structure 120 of FIG. 2, and is described in greater detail hereinafter.

Referring to FIG. 5, the connection structure 120 may be disposed on connection regions AR1 and AR2 of the first substrate 102. The connection regions AR1 and AR2 may include a first connection region AR1 providing data signals to the semiconductor device, and a second connection region AR2 providing control/address signals to the semiconductor device. The first and second regions AR1 and AR2 may be edge portions of the first substrate 102.

In some embodiments, if the first substrate 102 has a polygon-shape in a plan view, the first and second regions AR1 and AR2 may face each other with respect to a line BL passing through a center of the first substrate 102 and connecting vertexes not neighboring each other.

The connection structure 120 may include first connection patterns 120a disposed on the first connection region AR1 and second connection patterns 120b disposed on the second connection region AR2. Each of the first and second connection patterns 120a and 120b may include a solder ball. The first connection patterns 120a may be arranged in a row direction and a column direction, and the second connection patterns 120b may also be arranged in the row direction and the column direction with respect to a plan view. In some embodiments, the number of the first connection patterns 120a may be greater than the number of the second connection patterns 120b. Thus, sizes of the first and second regions AR1 and AR2 may be asymmetric to each other. In other words, the size of the first connection region AR1 may be greater than the size of the second connection region AR2.

Referring to FIG. 5, if the first substrate 102 has a square-shape in a plan view, the first substrate 102 may include first to fourth segments SE1, SE2, SE3, and SE4. The first connection patterns 120a may be disposed to be adjacent to the first and second segments SE1 and SE2, and the second connection patterns 120b may be disposed to be adjacent to the third and fourth segments SE3 and SE4.

In some embodiments, if the first connection patterns 120a are aligned along three columns, the second connection patterns 120b may be aligned along one column. Each of the first and second connection patterns 120a and 120b may include a solder ball. A size of each of the second connection patterns 120b may be greater than a size of each of the first connection patterns 120a.

According to an embodiment, the number of the first connection patterns 120a can be increased to satisfy a requirement that includes an improvement in the integration of the semiconductor device. However, the number of the second connection patterns 120b can be reduced. Thus, it is possible to suppress the increase of the size of the semiconductor device, notwithstanding that the number of first connection patterns 120a can be increased. Additionally, the reduced number of second connection patterns 120b can have sizes that are increased so that an electrical reliability of the second connection patterns 120b may be improved.

Furthermore, since the number of the second connection patterns 120b may be reduced to secure an area, the freedom degree of design of the first and second connection patterns 120a and 120b may be increased by the secured area.

Figure 6:
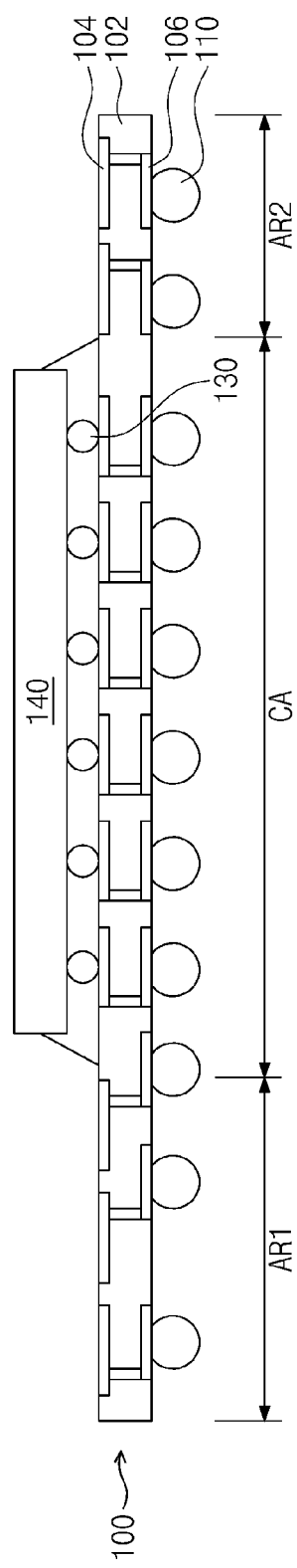
FIGS. 6 and 7 are cross-sectional views illustrating a method of manufacturing a semiconductor device, according to some embodiments of the inventive concepts.
Figure 7:
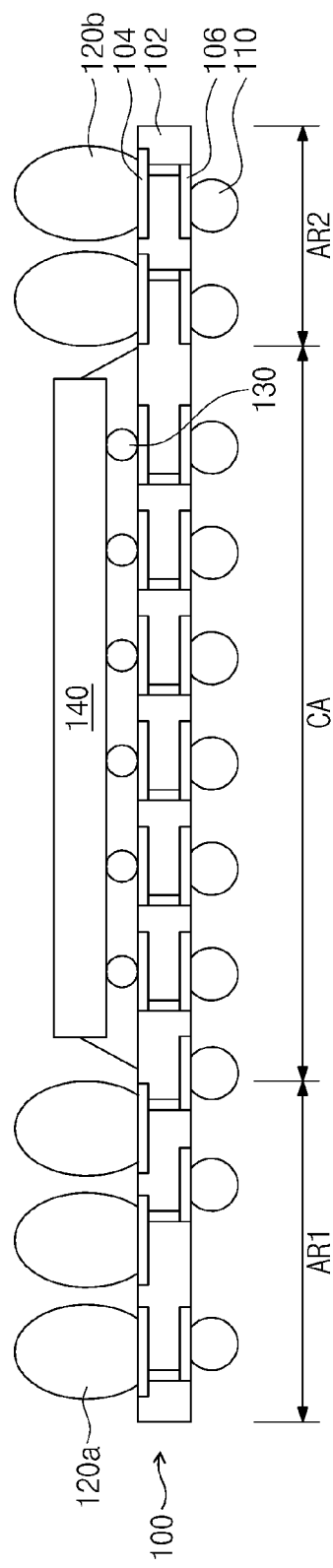

FIGS. 6 and 7 are cross-sectional views illustrating a method of manufacturing a semiconductor device according to some embodiments of the inventive concept.

Referring to FIG. 6, a first semiconductor chip 140 may be mounted on a first substrate 102. In particular, connecting terminals 130 may be formed on first pads 104 formed on a chip region CA of the first substrate 102, respectively, such that the connecting terminals 130 provide an electrical connection between the first semiconductor chip 140 and the first pads 104 at the chip region CA. Each of the connecting terminals 130 may include a solder ball. After the first semiconductor chip 140 is positioned on the connecting terminals 130, an underfill process may be performed to form a underfiller covering the connecting terminals 130.

Referring to FIG. 7, a connection structure 120 may be formed on connection regions AR1 and AR2 of the first substrate 102.

The connection structure 120 may include a plurality of first connection patterns 120a applied with data signals and a plurality of second connection patterns 120b applied with control/address signals. The first and second connection patterns 120a and 120b may be constructed and arranged to at least substantially surround the first semiconductor chip 140 mounted on the first substrate 102 with respect to a plan view.

The first connection patterns 120a may be disposed to be adjacent first and second segments SE1 and SE2 of the first substrate 120 so as to constitute a plurality of rows and columns. In some embodiments, for example, as illustrated in FIGS. 2 and 5, the first connection patterns 120a may be aligned along three columns. In other embodiments, as illustrated in FIG. 3, the first connection patterns 120a may have spaces SP where one or more of the first connection patterns 120a of FIGS. 2 and 5 are removed.

The second connection patterns 120b may be disposed to be adjacent to third and fourth segments SE3 and SE4 so as to constitute rows and columns. In some embodiments, as illustrated in FIGS. 2 and 5, the second connection patterns 120b may be aligned along two columns. In this case, a size of the first connection patterns 120a and the second connection patterns 120b may be substantially the same.

Referring to FIG. 1 again, a second semiconductor package 200 may be mounted on the first substrate 120 having the connection structure 120. A process for mounting the second semiconductor package 200 on the first substrate 102 may be substantially the same as a general process that is known to those of ordinary skill in the art.

Figure 8:
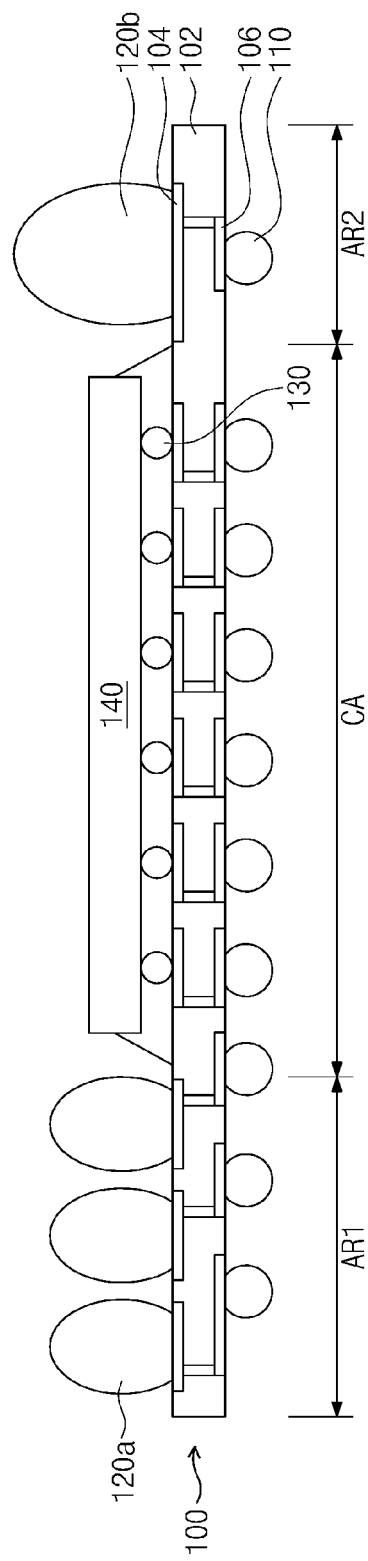
FIG. 8 is a cross-sectional view illustrating a method of manufacturing a semiconductor device according to other embodiments of the inventive concepts.

FIG. 8 is a cross-sectional view illustrating a method of manufacturing a semiconductor device according to other embodiments of the inventive concept.

As illustrated in FIG. 6, the semiconductor chip 140 may be mounted on the first substrate 102.

Referring to FIG. 8, the second connection patterns 120b may be aligned along one column. In this case, a size of each of the second connection patterns 120b may be greater than a size of each of the first connection patterns 120a, respectively.

Referring to FIG. 3 again, a second semiconductor package 200 may be mounted on the first substrate 102 having the connection structure 120. A process mounting the second semiconductor package 200 on the first substrate 102 may be substantially the same as a general process known to those of ordinary skill in the art.

Figure 9:
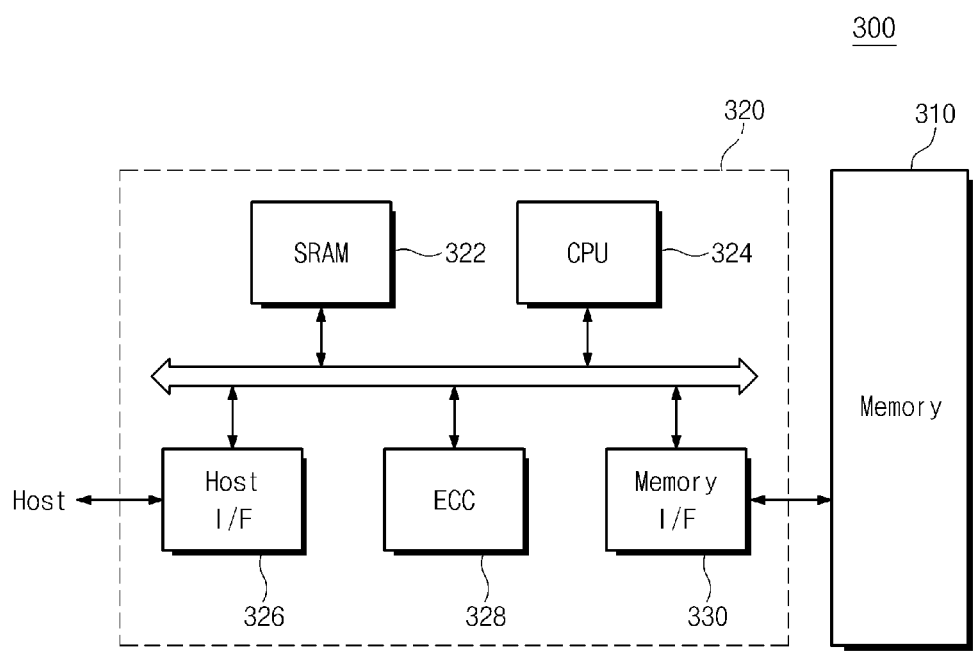
FIG. 9 is a schematic block diagram illustrating a memory card including semiconductor devices according to embodiments of the inventive concepts.

FIG. 9 is a schematic block diagram illustrating a memory card 300 including semiconductor devices according to embodiments of the inventive concepts.

Referring to FIG. 9, the memory card 300 can include at least one semiconductor device according to the aforementioned embodiments. For example, the memory card 300 may include a memory controller 320 that controls data communication between a host and a memory device 310. A SRAM device 322 may be used as an operation memory of a central processing unit (CPU) 324. The CPU 324 controls overall operations of the memory controller 320. A host interface unit 326 may be configured to include a data communication protocol between the memory card 300 and the host. An error check and correction (ECC) block 328 may detect and correct data errors, which are read from the memory device 310. A memory interface unit 330 may provide an interface for the memory device 310.

If the memory device 310 applied to the memory card 300 includes the semiconductor device according to embodiments of the inventive concepts, a number of first connection patterns, for example, first connection patterns 120a described above, which are applied with the data signals, may be increased to improve the reliability of the memory card 300. On the other hand, the number of the second connection patterns, for example, second connection patterns 120b described above, which are applied with the control/address signals, may be maintained or reduced to suppress an increase in size of the semiconductor device.

Figure 10:
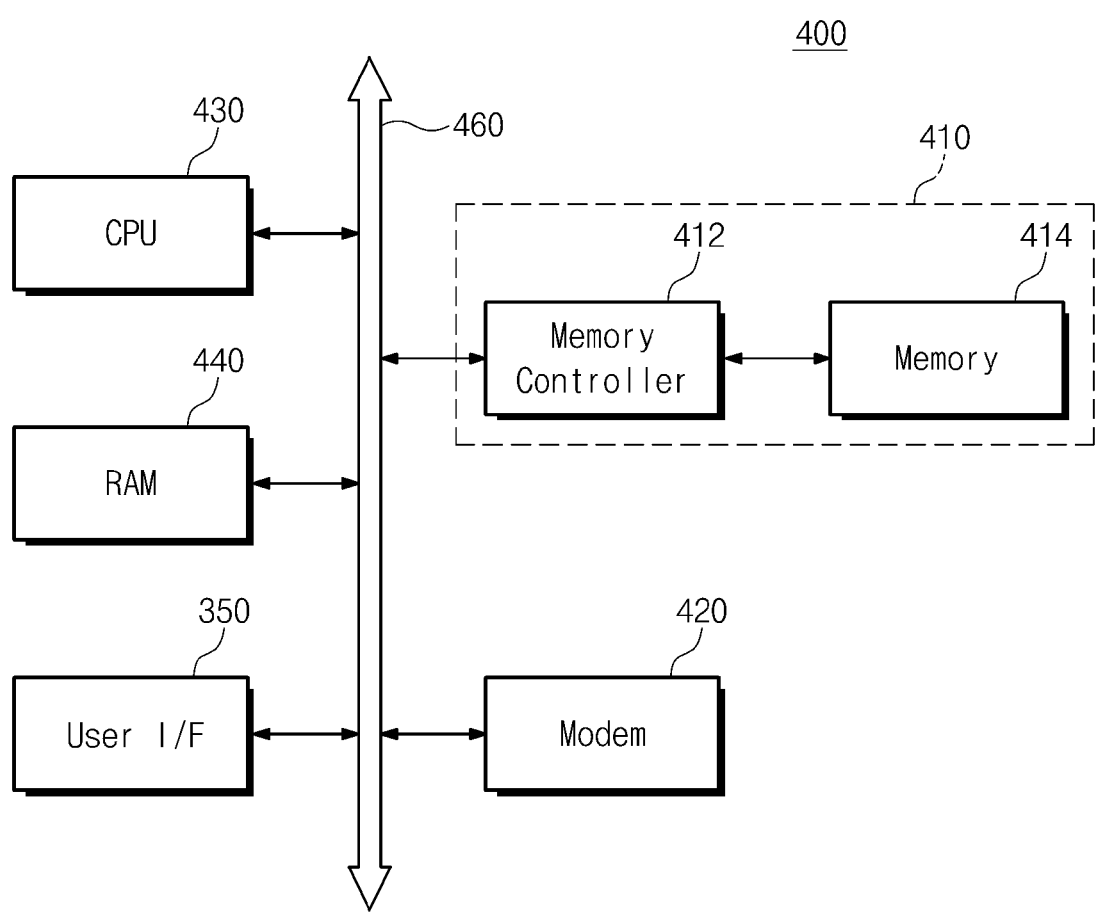
FIG. 10 is a schematic block diagram illustrating an example of systems including semiconductor devices according to embodiments of the inventive concepts.

FIG. 10 is a schematic block diagram illustrating an example of systems including semiconductor devices according to embodiments of the inventive concepts.

Referring to FIG. 10, an information processing system 400 may include a semiconductor device according to embodiments of the inventive concepts. The information processing system 400 may include a mobile device or a computer. For example, the information processing system 400 may include a modem 420, a central processing unit (CPU) 430, a random access memory (RAM) 440, and a user interface unit 450 that are electrically connected to a memory system 410 through a system bus 460. The memory system 410 may store data processed by the central processing unit 430 or data inputted from an external device. The memory system 410 may include a memory device 412 and a memory controller 414. The memory system 410 may include some or all elements that are substantially the same as those of the memory card 300 described with reference to FIG. 9. The information processing system 400 may be realized as a memory card, a solid state disk (SSD) device, a camera image sensor, and/or other types of application chipset. For example, the memory system 410 may comprise the SSD device. In this case, the information processing system 400 may stably and reliably store massive quantities of data.

While the inventive concepts have been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor device comprising:
    a first semiconductor package including a first substrate, the first substrate including a first region and a second region;
    a second semiconductor package mounted on the first semiconductor package; and
    a connection structure electrically connecting the second semiconductor package and the first semiconductor package, wherein the connection structure comprises:
        first connection patterns at the first region, the first connection patterns providing data signals at the first region; and
        second connection patterns at the second region, the second connection patterns providing control/address signals at the second region, wherein a number of the second connection patterns providing control/address signals at the second region is less than a number of the first connection patterns providing data signals at the first region.

2. The semiconductor device of claim 1, wherein the first semiconductor package further comprises:
    a first semiconductor chip at a center portion of the first substrate.

3. The semiconductor device of claim 2, wherein the first and second regions are at edge portions of the first substrate, wherein the first substrate includes a first vertex at a first intersection of the first region and the second region and a second vertex at a second intersection of the first region and the second region, the first and second vertices not neighboring each other, and wherein a bit line extends through a center of the first substrate to connect the first and second vertices.

4. The semiconductor device of claim 1, wherein the first connection patterns include a plurality of first solder balls, and the first solder balls are aligned along a plurality of columns, and wherein the second connection patterns include a plurality of second solder balls, and the second solder balls are aligned along at least one column.

5. The semiconductor device of claim 4, wherein the number of the columns of the first connection patterns is greater than the number of the at least one column of the second connection patterns.

6. The semiconductor device of claim 4, wherein a separation distance between two or more first connection patterns is greater than a mean value of separation distances between the first connection patterns.

7. The semiconductor device of claim 6, wherein the two or more first connection patterns are spaced apart from each other by the separation distance greater than the mean value and are adjacent a center portion of the first substrate.

8. The semiconductor device of claim 1, wherein a size of each of the first connection patterns is smaller than a size of each of the second connection patterns.

9. The semiconductor device of claim 1, wherein the second semiconductor package includes a second substrate and at least one semiconductor chip on the second substrate.

10. The semiconductor device of claim 1, wherein a surface area of the first region is greater than a surface area of the second region.

* * * * *